US012573594B2

(12) United States Patent
Downey et al.

(10) Patent No.:    US 12,573,594 B2
(45) Date of Patent:        Mar. 10, 2026

(54) PROTECTIVE LINER FOR PLASMA SOURCE

(71) Applicant: Applied Materials, Inc., Santa Clara, CA (US)

(72) Inventors: Ryan T. Downey, San Jose, CA (US); James L'Heureux, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 62 days.

(21) Appl. No.: 18/621,280

(22) Filed: Mar. 29, 2024

(65) Prior Publication Data

US 2025/0201530 A1      Jun. 19, 2025

Related U.S. Application Data

(60) Provisional application No. 63/612,064, filed on Dec. 19, 2023.

(51) Int. Cl.
H01J 37/32            (2006.01)
(52) U.S. Cl.
CPC ..... H01J 37/32495 (2013.01); H01J 37/3211 (2013.01); H01J 37/32467 (2013.01); H01J 2237/0213 (2013.01)
(58) Field of Classification Search
CPC ............. H01J 37/32495; H01J 37/3211; H01J 37/321; H01J 37/32467
See application file for complete search history.

(56) References Cited

U.S. PATENT DOCUMENTS 9,155,184 B2    10/2015    Ng et al.
9,378,928 B2    6/2016    Zeng et al.

10,187,966 B2    1/2019    Wang et al.
10,757,797 B2    8/2020    Wang et al.
2007/0190266 A1*    8/2007    Fu ..................... H01L 21/02063
                                                            427/255.28
2014/0360670 A1    12/2014    Chen et al.
2017/0027049 A1*    1/2017    Wang .................... C23C 16/507
2018/0221816 A1    8/2018    Van Gompel et al.
2023/0377848 A1*    11/2023    Holman ............ H01J 37/32201

FOREIGN PATENT DOCUMENTS

KR            20230060489 A        5/2023
WO        WO-2014210141 A1 *    12/2014        .......... H01J 37/3244
WO            2019-038382 A1        2/2019

OTHER PUBLICATIONS

International Search Report and Written Opinion dated Mar. 10, 2025 for Application No. PCT/US2024/056956.

* cited by examiner

*Primary Examiner* — Patrick C Chen
(74) *Attorney, Agent, or Firm* — Patterson + Sheridan, LLP

(57)            ABSTRACT

A plasma source is provided including: a dielectric tube having one or more interior surfaces extending from a first opening at a first end of the dielectric tube to a second opening at a second end of the dielectric tube; a coil antenna disposed around the dielectric tube; and a dielectric liner positioned inside the dielectric tube. The dielectric liner includes one or more outer surfaces. The dielectric liner is disposed around an interior plasma-generating volume of the plasma source. The dielectric liner extends from a first end of the dielectric liner to a second end of the dielectric liner, and the dielectric liner covers the one or more interior surfaces of the dielectric tube.

18 Claims, 4 Drawing Sheets

PROTECTIVE LINER FOR PLASMA SOURCE

RELATED APPLICATIONS

This application claims benefit of and priority to U.S. Provisional Patent Application No. 63/612,064, filed Dec. 19, 2023, the entire contents of which are incorporated herein by reference.

BACKGROUND

Field

Embodiments of the present disclosure generally relate to plasma sources used in connection with the processing of substrates, such as semiconductor substrates.

Description of the Related Art

The processes used by semiconductor processing facilities produce many undesirable compounds, such as perfluorinated compounds (PFCs), which are abated or treated before disposal, due to regulatory requirements and environmental and safety concerns. Typically, a plasma source may be coupled to the exhaust of a process chamber to abate the compounds exiting the process chamber. High density inductively coupled plasma (ICP) is one type of plasma source that can be used for the abatement of PFCs or other compounds.

An ICP plasma source may include one or more coils surrounding a dielectric tube. High frequency power (e.g., radio frequency power) can be applied to the one or more coils to generate varying electromagnetic fields that can be used to generate the inductive plasma in the plasma source. Although the inductive plasma inside the dielectric tube assists in causing undesirable compounds (e.g., PFC's) to dissociate into less harmful materials, the inductive plasma also damages the dielectric tube. For example, the plasma can erode the dielectric tube and form deposits on the interior walls of the dielectric tube, which can both eventually lead to costly and time-consuming cleaning procedures or replacement of the dielectric tube.

Thus, there is a need for an abatement system that can achieve the benefits of inductive plasma abatement processes without the downtime and costs associated with cleaning the interior walls of the plasma abatement system or replacement of the dielectric tube.

SUMMARY

Embodiments of the present disclosure generally relate to plasma sources used in connection with the processing of substrates, such as semiconductor substrates.

In one embodiment, a plasma source is provided comprising: a dielectric tube having one or more interior surfaces extending from a first opening at a first end of the dielectric tube to a second opening at a second end of the dielectric tube; a coil antenna disposed around the dielectric tube; and a dielectric liner positioned inside the dielectric tube, wherein the dielectric liner includes one or more outer surfaces, the dielectric liner is disposed around an interior plasma-generating volume of the plasma source, the dielectric liner extends from a first end of the dielectric liner to a second end of the dielectric liner, and the dielectric liner covers the one or more interior surfaces of the dielectric tube.

In another embodiment, an abatement system is provided comprising: a power source; and a plasma source comprising: a dielectric tube having one or more interior surfaces extending from a first opening at a first end of the dielectric tube to a second opening at a second end of the dielectric tube; a coil antenna disposed around the dielectric tube, the coil antenna electrically connected to the power source; and a dielectric liner positioned inside the dielectric tube, wherein the dielectric liner includes one or more outer surfaces, the dielectric liner is disposed around an interior plasma-generating volume of the plasma source, the dielectric liner extends from a first end of the dielectric liner to a second end of the dielectric liner, and the dielectric liner is configured to be moved through the first opening or the second opening of the dielectric tube.

In another embodiment, a plasma source is provided comprising: a dielectric tube having one or more interior surfaces extending from a first opening at a first end of the dielectric tube to a second opening at a second end of the dielectric tube; a coil antenna disposed around the dielectric tube; and a dielectric liner positioned inside the dielectric tube, wherein the dielectric liner includes one or more outer surfaces, the dielectric liner is disposed around an interior plasma-generating volume of the plasma source, the dielectric liner extends from a first end of the dielectric liner to a second end of the dielectric liner, and is configured to be removed through the first opening or the second opening of the dielectric tube, the one or more outer surfaces of the dielectric liner are spaced apart from the dielectric tube by a gap of less than about 0.02 inches, and the dielectric liner has a thickness from about 0.05 inches to about 0.20 inches.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to plasma sources used in connection with the processing of substrates, such as semiconductor substrates. The plasma sources disclosed herein include a protective dielectric liner positioned between a dielectric tube and the interior plasma-generating volume of the plasma source. The protective dielectric liner shields the dielectric tube from the plasma generated inside the plasma source, which prevents erosion of the dielectric tube and prevents particles from depositing on the dielectric tube. Although the plasma generated in the plasma source can also result in erosion of the dielectric liner and particle deposition on the dielectric liner, the dielectric liner can be quickly and easily replaced with a new dielectric liner, so that downtime of the process equipment can be reduced, and the plasma source can resume operating as intended when the new dielectric liner is installed as described in further detail below.

Although the following disclosure mainly describes the use of protective liners in plasma sources used for plasma abatement processes, the benefits of this disclosure can also be applied to other plasma sources used for other processes, such as remote plasma sources used to provide plasma to process chambers.

Figure 1:
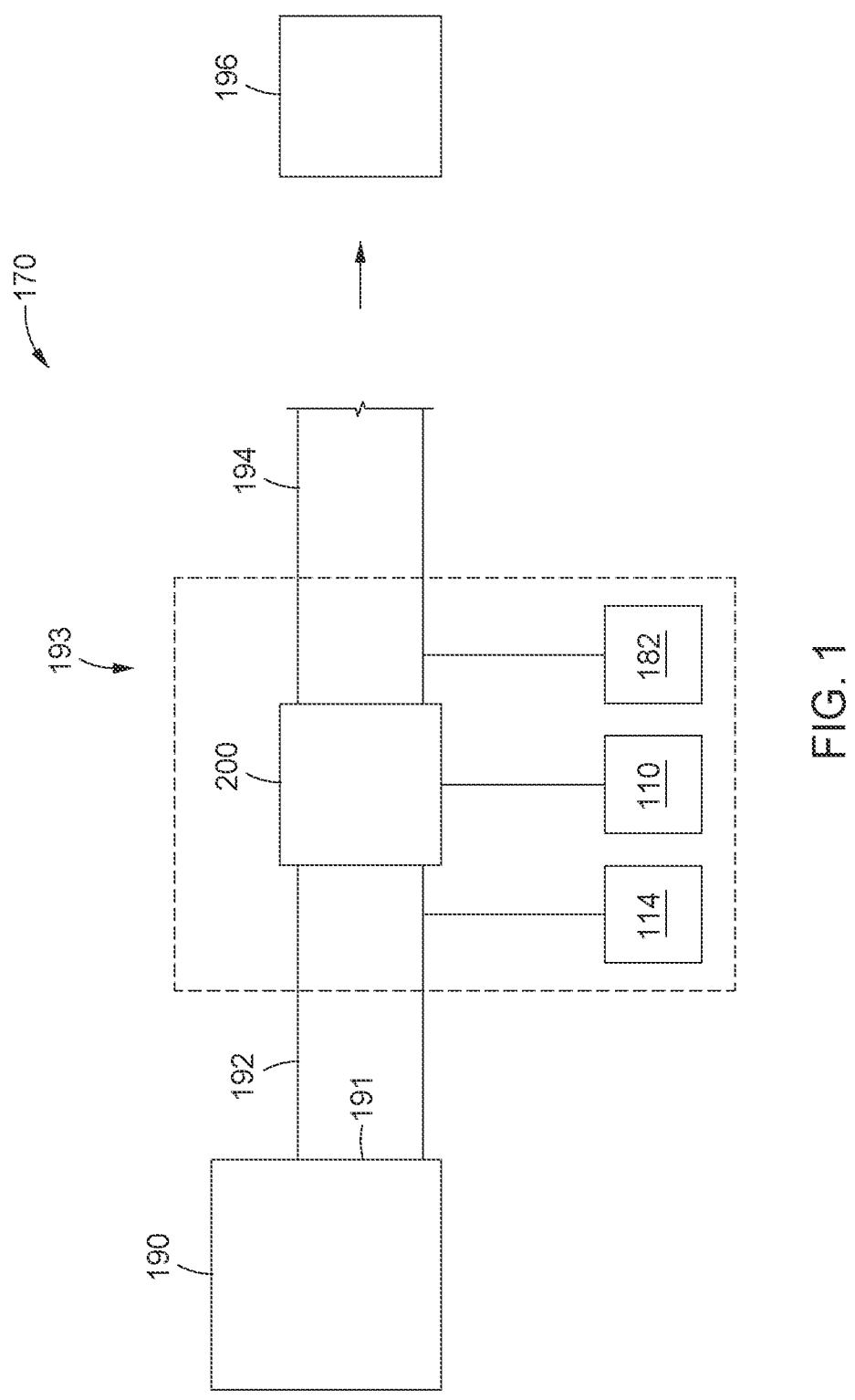
FIG. 1 is a schematic side view of a processing system, according to one embodiment.

FIG. 1 is a schematic side view of a processing system 170, according to one embodiment. The processing system 170 includes a process chamber 190 and an abatement system 193 connected to the exhaust of the process chamber 190. The abatement system 193 includes a plasma source 200. Additional details on the plasma source 200 are provided below in reference to the description of FIGS. 2A-2C.

The process chamber 190 is generally configured to perform at least one process on a substrate, such as a deposition process, an etch process, a plasma treatment process, a preclean process, an ion implant process, or other process performed on semiconductor substrates or other substrates. The process chamber 190 has a chamber exhaust port 191 coupled to the plasma source 200 of the abatement system 193 via an exhaust line 192. An exhaust of the plasma source 200 is coupled by an exhaust conduit 194 to pumps and a facility exhaust system, schematically indicated by a single reference numeral 196 in FIG. 1. The pumps are generally utilized to evacuate the process chamber 190, while the facility exhaust generally includes scrubbers or other exhaust cleaning apparatus for preparing the effluent of the process chamber 190 to enter the atmosphere or additional treatment.

The plasma source 200 is utilized to perform an abatement process on compounds, such as gases (e.g., fluorinated gases, such as PFCs) and/or other materials exiting the process chamber 190, so that these gases and/or other materials may be converted into more environmentally friendly and/or process-equipment friendly compositions.

In addition to the plasma source 200, the abatement system 193 can include a power source 110, a gas source 114, and a pressure regulating module 182. The power source 110 may be electrically connected to coils in the plasma source 200 as described in fuller detail below. In some embodiments, the power source 110 can be a radio frequency (RF) power source that can provide RF energy to form a plasma within an interior volume of the plasma source 200. The plasma formed in the interior volume of the plasma source 200 can assist in breaking down compounds in the exhaust from the process chamber 190, so that the compounds are dissociated into less harmful materials. In some embodiments, RF energy may be provided by the power source 110 to the coils of the plasma source 200 at power levels greater than 3 kW, such as 6 KW. In some embodiments, the frequency of the RF energy may range from about 10 KHz to about 60 MHz.

In some embodiments, the abatement system 193 also includes a gas source 114. The gas source 114 can store an abating reagent that can be supplied to at least one of the exhaust line 192 or the plasma source 200. The abating reagent can assist in converting the compounds exiting the process chamber 190 into more environmentally friendly and/or process-equipment friendly compositions when the plasma is formed in the interior volume of plasma source 200. Some examples of abatement reagents that can be used include $H_2$, $O_2$, $H_2O$, and other suitable abatement reagents.

The pressure regulating module 182 may be coupled to at least one of the plasma source 200 or the exhaust conduit 194. In some embodiments, the pressure regulating module 182 can be used to inject a pressure regulating gas, such as argon, nitrogen, or other suitable gases to assist in controlling the pressure within the plasma source 200, so that the abatement process can be performed more efficiently.

Figure 2A:
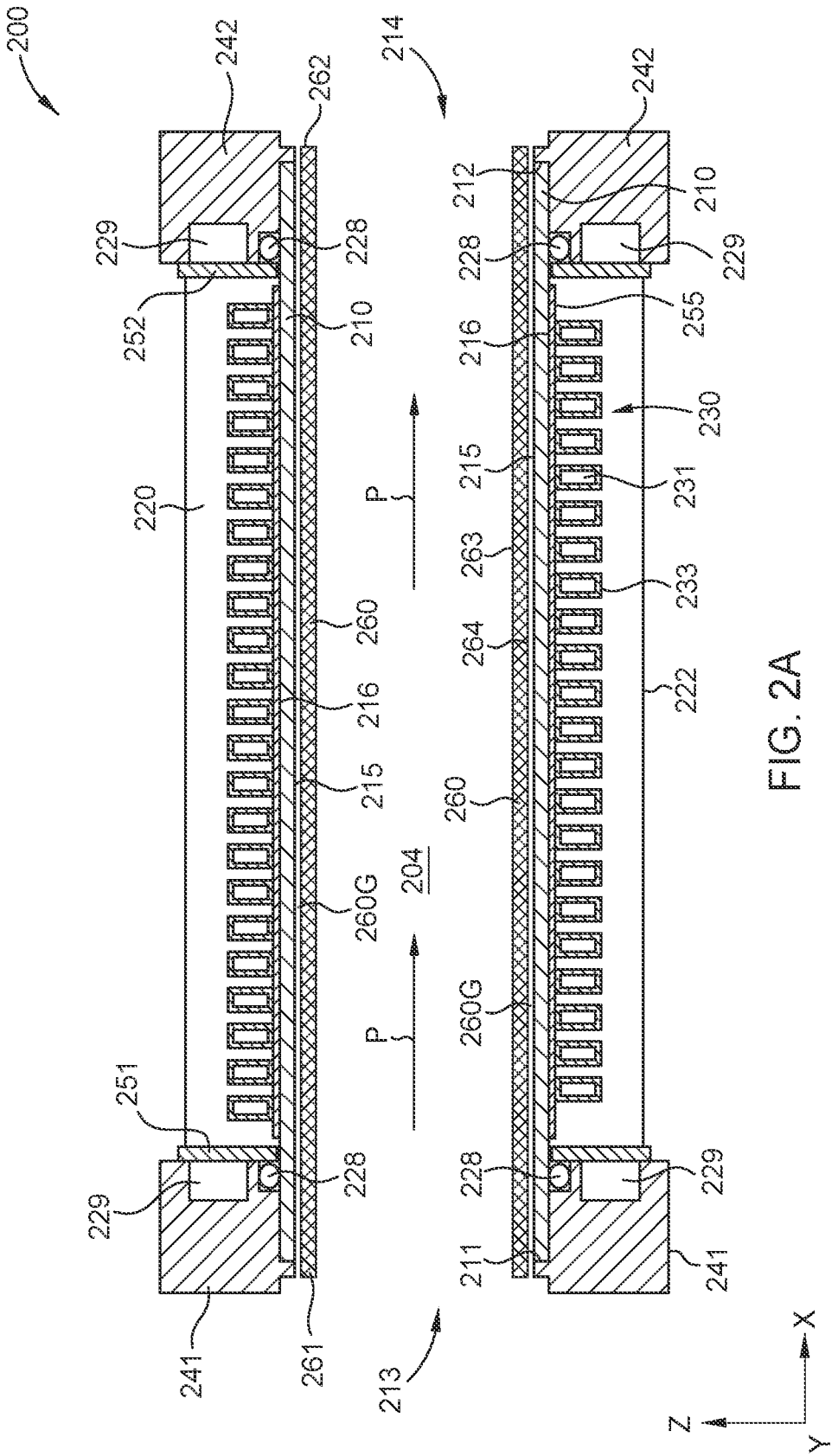
FIG. 2A is a side cross-sectional view of the plasma source from FIG. 1, according to one embodiment.

FIG. 2A is a side cross-sectional view of the plasma source 200 from FIG. 1, according to one embodiment. The exhaust from the process chamber 190 can flow through the plasma source 200 along a gas flow path P in the X-direction towards the exhaust conduit 194 (see FIG. 1). Notably, the gas flow path P through the plasma source 200 is a straight-line path from the inlet to the outlet of the plasma source 200, which enables easier replacement of the dielectric liner of the plasma source 200 as described in fuller detail below. The plasma source 200 can generate a plasma from the exhaust gases flowing through the plasma source 200 to convert compounds in the exhaust to more environmentally friendly and/or process-equipment friendly compounds.

The plasma source 200 includes a dielectric tube 210, a dielectric liner 260 positioned inside the dielectric tube 210, and a coil antenna 230 disposed around the dielectric tube 210. The dielectric liner 260 can have a similar tube shape as the dielectric tube 210, such as a cylindrical shape. The dielectric liner 260 can be disposed around an interior volume 204 of the plasma source 200. Power, such as RF power, can be provided to the coil antenna 230 from the power source 110 (see FIG. 1) to generate a plasma of the exhaust gases flowing through the plasma source 200. The coil antenna 230 can include a plurality of turns 233 as the coil antenna wraps around the dielectric tube 210 along the length of the dielectric tube 210 in the X-direction. In some embodiments, the coil antenna 230 can be formed of copper tubing. Coolant can also be provided to flow through channels 231 of the coil antenna 230 to assist in cooling the dielectric tube 210 during plasma processing.

The plasma source 200 can further include a cover 222 positioned around the dielectric tube 210 and the coil antenna 230. The plasma source 200 can also include a potting material 220 between the dielectric tube 210 and the cover 222. The dielectric tube 210 is generally bonded to the coil antenna 230 with the potting material 220 making replacement of the dielectric tube 210 difficult and time-consuming or potentially unfeasible. The potting material 220 also aids in heat transfer between the coil antenna 230 and the dielectric tube 210.

The plasma source 200 can further include a first flange 241 and a second flange 242. With reference to FIG. 1, the first flange 241 can be used to connect the plasma source 200 to a corresponding flange (not shown) on the exhaust line 192 (see FIG. 1). Similarly, the second flange 242 can be used to connect the plasma source 200 to a corresponding flange (not shown) on the exhaust conduit 194 (see FIG. 1). Each flange 241, 242 can include a coolant channel 229 to assist in cooling the plasma source 200 during processing.

In some embodiments, a deformable layer 255 may be disposed between the coil antenna 230 and the dielectric tube 210 to assist in providing a good thermal conduction path between the coil antenna 230 and the dielectric tube 210. The deformable layer 255 can be formed of an electrically insulating and thermally conductive material, such as silicon rubber. The potting material 220 is also formed of a thermally conductive material to increase the heat transfer from the dielectric tube 210 to the coolant flowing through the coil antenna 230.

The dielectric tube 210 can include a first end 211 and second end 212 that is spaced apart from the first end 211 in the X-direction. The dielectric tube 210 can include a first opening 213 serving as a gas inlet at the first end 211 and a second opening 214 serving as a gas outlet at the second end 212. Gas can flow into the plasma source 200 at the first opening 213, and gas as well as plasma can flow out of the plasma source 200 at the second opening 214. The dielectric tube 210 can further include one or more interior surfaces 215 and one or more outer surfaces 216. The one or more interior surfaces 215 can extend from the first opening 213 at the first end 211 to the second opening 214 at the second end 212. In FIG. 2A, the dielectric tube 210 can have a cylindrical profile that can include a single continuous interior surface, but other embodiments can include other profiles, such as rectangular that can include more than one interior surface. The dielectric tube 210 may be fabricated from any suitable dielectric material, such as aluminum oxide, sapphire, quartz, aluminum nitride, or other suitable dielectric (e.g., ceramic) material to allow the transmission of RF power to the inner volume 204 to generate the plasma.

The dielectric liner 260 is disposed around the interior plasma-generating volume 204 of the plasma source 200. The dielectric liner 260 extends in the X-direction from a first end 261 to a second end 262. The dielectric liner 260 can be sized and positioned in the dielectric tube 210 to cover all of the one or more interior surfaces 215 of the dielectric tube 210. In some embodiments, the dielectric liner 260 can have a length (second length) in the X-direction that is longer than the corresponding length (first length) of the dielectric tube 210 in the X-direction to ensure that the dielectric liner 260 covers all of the interior surfaces of the dielectric tube 210. This coverage enables the dielectric liner 260 to shield the dielectric tube 210 from erosion caused by plasma sputtering and deposits that would occur during plasma processes performed by the plasma source 200 if the dielectric liner 260 was not used. Performing plasma processes with the plasma source 200 results in the accumulation of deposits on the dielectric liner 260 and erosion of the dielectric liner 260 instead of the dielectric tube 210. This accumulation of deposits and erosion of material of the dielectric liner 260 can eventually negatively affect the properties of the plasma formed in the interior volume 204 of the plasma source 200. To prevent this negative affect, the dielectric liner 260 can be easily and quickly replaced with a new dielectric liner as described in further detail below, which prevents any significant downtime for the equipment connected to the plasma source 200, such as the process chamber 190 (see FIG. 1).

The dielectric liner 260 can include one or more interior surfaces 263 and one or more outer surfaces 264. The dielectric liner 260 generally has a similar shape as the dielectric tube 210, such as both having a cylindrical shape that is hollow in the center. The one or more outer surfaces 264 of the dielectric liner 260 can be spaced apart from the one or more inner surfaces 215 of the dielectric tube 210 by a gap 260G. The gap 260G allows the dielectric liner 260 to be easily positioned inside the dielectric tube 210 and removed from the dielectric tube 210 with little to no contact between dielectric liner 260 and the dielectric tube 210 during insertion and removal. The gap 260G also prevents conductive heat transfer between the dielectric liner 260 and the dielectric tube 210 during processing. Preventing conductive heat transfer between the dielectric tube 210 and the dielectric liner 260 can prevent damage from thermal shock since the cooled dielectric tube 210 can operate at a significantly cooler temperature than the dielectric liner 260 The gap 260G is also sized to reduce the likelihood of generating plasma in the gap 260G. For example, in some embodiments, the gap 260G can have a size from about 0.005 inches to about 0.1 inches, such as from about 0.01 inches to about 0.04 inches, such as less than about 0.02 inches. As described in further detail below in reference to FIG. 2B, a pair of supports 270A, 270B can be used to center the dielectric liner 260 in the dielectric tube 210, so that the size of the gap 260G can be relatively constant along the entire length of the dielectric tube 210 in the X-direction. In some embodiments, it may be beneficial to have thermal contact between the dielectric liner 260 and the dielectric tube 210. In these embodiments, the gap 260G can be omitted or filled with a material that ensures sufficient thermal contact between the dielectric liner 260 and the dielectric tube 210.

The dielectric liner 260 can have a thickness (Z-direction in FIG. 2A) from about 0.025 inches to about 0.5 inches, such as from about 0.05 inches to about 0.20 inches. The dielectric liner 260 can be formed any dielectric material suitable for coupling the RF energy provided to the coils 230 into the interior volume 204. In some embodiments, the dielectric liner 260 can be formed of one or more of aluminum oxide, aluminum nitride, quartz, and sapphire.

The dielectric liner 260 is configured to be easily inserted and removed from the dielectric tube 210. For example, the dielectric liner 260 can be inserted into or removed from the dielectric tube 210 by moving the dielectric liner 260 in the X-direction (first direction) through the first opening 213 or the second opening 214 of the dielectric tube 210. To insert or remove the dielectric liner 260, one of the corresponding flanges 241, 242 from the corresponding upstream or downstream equipment, such as the exhaust line 192 or the exhaust conduit 194, can be disconnected, so that the dielectric liner 260 can be moved in the X-direction to insert or remove the dielectric liner 260 from the dielectric tube 210. This process for replacing the dielectric liner 260 can be performed quickly, which substantially reduces the downtime associated with the accumulation of deposits and erosion inside the plasma source 200 when the dielectric tube 210 is used without the dielectric liner 260. Notably, the dielectric tube 210 is designed to have the first opening 213 be spaced apart from the second opening 214 along a straight-line path, so that there is line of sight between the first opening 213 and the second opening 214. This straight-line path between the gas inlet at the first opening 213 and the gas outlet at the second opening 214 enables the dielectric liner 260 to be easily inserted from either the first opening 213 or the second opening 214 of the dielectric tube 210.

The plasma source 200 can further include a first ring-shaped support 251 positioned outward of the outer surface 216 of the dielectric tube 210 and near the first end 211 of the dielectric tube 210. Similarly, the plasma source 200 can further include a second ring-shaped support 252 positioned outward of the outer surface 216 of the dielectric tube 210 and near the second end 212 of the dielectric tube 210. The first flange 241 can be attached to the first ring-shaped support 251. The second flange 242 can be attached to the second ring-shaped support 252. A seal 228 can be positioned (1) between the first flange 241 and the first ring-shaped support 251, and (2) between the first flange 242 and the second ring-shaped support 252.

Figure 2B:
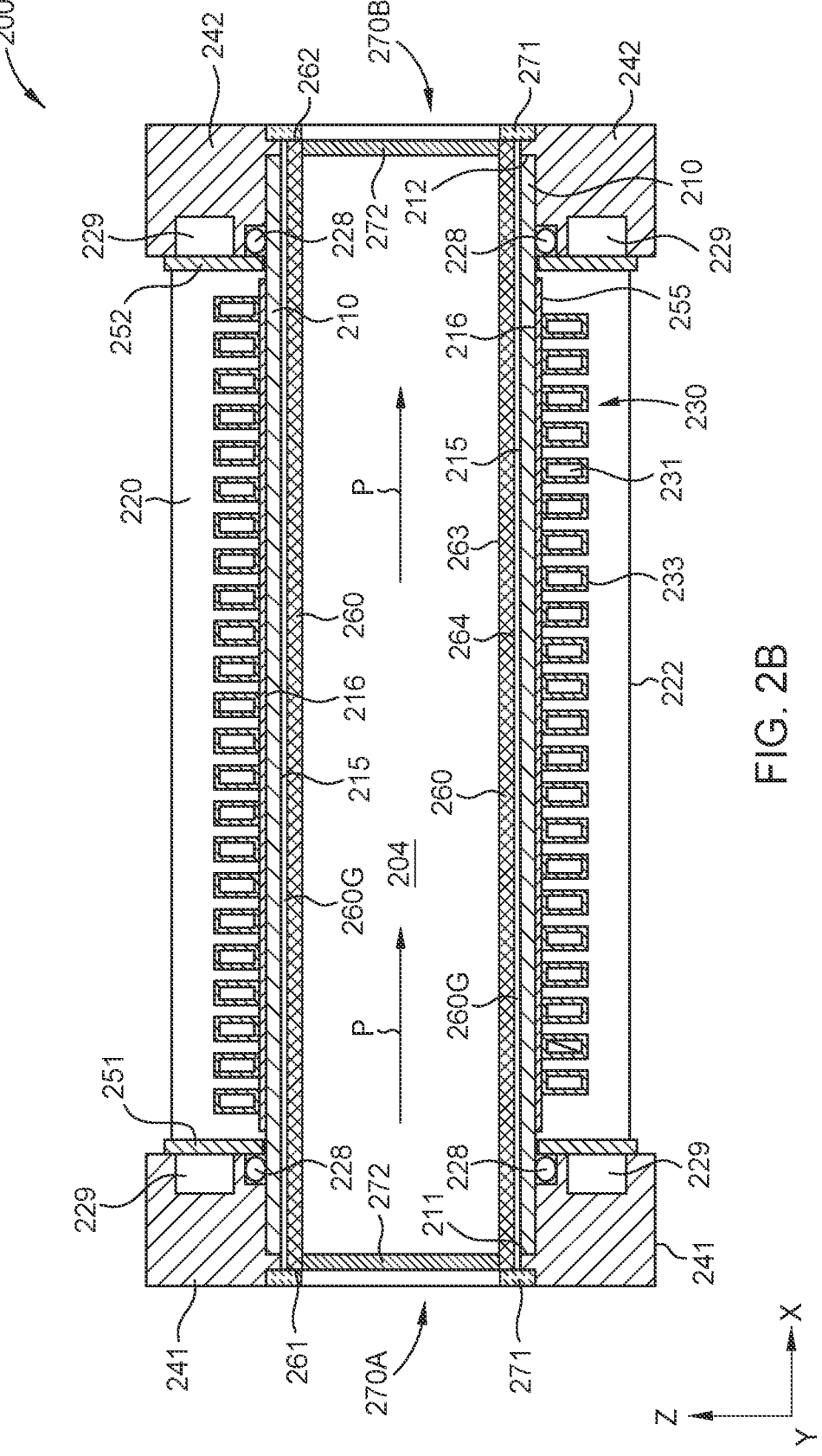
FIG. 2B shows the plasma source from FIG. 2A with a first support and a second support, according to one embodiment.

FIG. 2B shows the plasma source 200 from FIG. 2A with a first support 270A and a second support 270B, according to one embodiment. The first support 270A is positioned against the first flange 241. The second support 270B is positioned against the second flange 242. The supports 270A, 270 can be used to center the dielectric liner 260 in the dielectric tube 210, so that the gap 260G between the dielectric liner 260 and the dielectric tube 210 is relatively constant along the entire length of the dielectric tube 210 in the X-direction.

Each support 270A, 270B includes an outer member 271 and an inner support 272. The outer member 271 can have a ring shape and can be formed of a compressible material, such as rubber. In one embodiment, the inner support 272 can be formed of stainless steel. The outer member 271 can fit inside a recess of the corresponding flange 241, 242. The inner support 272 can extend inside of the dielectric liner 260. The interior surface 263 of the dielectric liner 260 can contact the corresponding inner support 272, so that the inner support 272 can center the dielectric liner 260 in the dielectric tube 210.

Figure 2C:
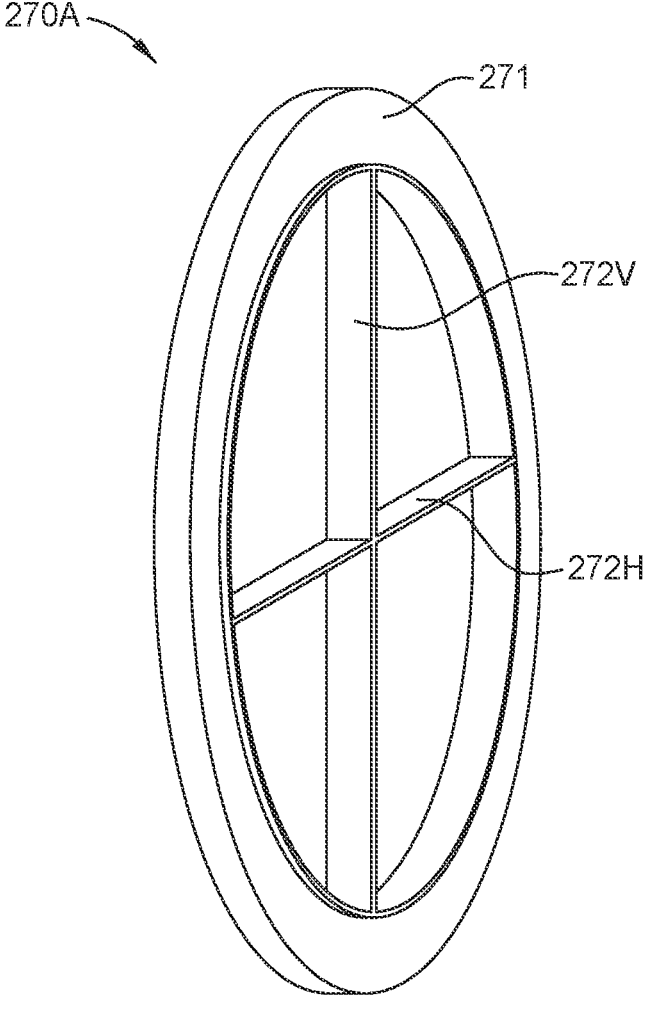
FIG. 2C is a perspective view of the first support from FIG. 2B, according to one embodiment.

FIG. 2C is a perspective view of the first support 270A from FIG. 2B, according to one embodiment. The second support 270B can have the same design as the first support 270A. The first support 270A includes the outer member 271, a vertical inner support 272V and a horizontal inner support 272H. The interior surface 263 of the dielectric liner 260 can contact the opposing ends of the vertical inner support 272V and the opposing ends of the horizontal inner support 272H to center the dielectric liner 260 in the dielectric tube 210. The supports 270A, 270B are just one example of supports that can be used to center the dielectric liner 260 in the dielectric tube 210, and other methods for centering the dielectric liner 260 within the dielectric tube are also envisioned to be within the scope of this disclosure.

While the foregoing is directed to embodiments of the present disclosure, other and further embodiments of the disclosure may be devised without departing from the basic scope thereof.

What is claimed is:

1. A plasma source comprising:
a dielectric tube having one or more interior surfaces extending from a first opening at a first end of the dielectric tube to a second opening at a second end of the dielectric tube;
a coil antenna disposed around the dielectric tube; and
a dielectric liner positioned inside the dielectric tube, wherein
the dielectric liner includes one or more outer surfaces,
the dielectric liner is disposed around an interior plasma-generating volume of the plasma source,
the dielectric liner extends from a first end of the dielectric liner to a second end of the dielectric liner,
the dielectric liner covers the one or more interior surfaces of the dielectric tube, and
the dielectric liner is positioned on one or more supports to center the dielectric liner in the dielectric tube.

2. The plasma source of claim 1, wherein the dielectric liner is configured to be moved through the first opening or the second opening of the dielectric tube.

3. The plasma source of claim 1, wherein the first end of the dielectric liner is spaced apart from the second end of the dielectric liner in a first direction, and the dielectric liner is configured to be removed from inside of the dielectric tube by moving the dielectric liner in the first direction.

4. The plasma source of claim 1, wherein the one or more outer surfaces of the dielectric liner are spaced apart from the dielectric tube by a gap.

5. The plasma source of claim 4, wherein the gap is less than about 0.02 inches.

6. The plasma source of claim 1, wherein
the one or more interior surfaces of the dielectric tube extend along a first length from a first end of the dielectric tube to a second end of the dielectric tube,
the one or more outer surfaces of the dielectric tube extend along a second length from a first end of the dielectric liner to a second end of the dielectric liner, and
the second length of the dielectric liner is longer than the first length of the dielectric tube.

7. The plasma source of claim 1, wherein the coil antenna is a tube including a cooling channel configured to cool the dielectric tube.

8. The plasma source of claim 1, wherein
the first opening of the dielectric tube is spaced apart from the second opening of the dielectric tube by a straight-line path,
the first opening is a gas inlet for the plasma source, and
the second opening is a gas outlet for the plasma source.

9. The plasma source of claim 1, wherein the dielectric liner is formed of aluminum oxide.

10. An abatement system comprising:
a power source; and
a plasma source comprising:
a dielectric tube having one or more interior surfaces extending from a first opening at a first end of the dielectric tube to a second opening at a second end of the dielectric tube;
a coil antenna disposed around the dielectric tube, the coil antenna electrically connected to the power source; and
a dielectric liner positioned inside the dielectric tube, wherein
the dielectric liner includes one or more outer surfaces,
the dielectric liner is disposed around an interior plasma-generating volume of the plasma source,
the dielectric liner extends from a first end of the dielectric liner to a second end of the dielectric liner,
the dielectric liner is configured to be moved through the first opening or the second opening of the dielectric tube, and
the dielectric liner is positioned on one or more supports to center the dielectric liner in the dielectric tube.

11. The abatement system of claim 10, wherein the dielectric liner covers all of the one or more interior surfaces of the dielectric tube.

12. The abatement system of claim 10, wherein the first end of the dielectric liner is spaced apart from the second end of the dielectric liner in a first direction, and the dielectric liner is configured to be removed from inside of the dielectric tube by moving the dielectric liner in the first direction.

13. The abatement system of claim 10, wherein the one or more outer surfaces of the dielectric liner are spaced apart from the dielectric tube by a gap.

14. The abatement system of claim 13, wherein the gap is less than about 0.02 inches.

15. The abatement system of claim 10, wherein
the one or more interior surfaces of the dielectric tube
extend along a first length from a first end of the
dielectric tube to a second end of the dielectric tube,
the dielectric liner has one or more inner surfaces and one
or more outer surfaces,
the one or more outer surfaces of the dielectric tube
extend along a second length from a first end of the
dielectric liner to a second end of the dielectric liner,
and
the second length of the dielectric liner is longer than the
first length of the dielectric tube.

16. The abatement system of claim 10, wherein the
dielectric liner has a thickness from about 0.05 inches to
about 0.20 inches.

17. The abatement system of claim 10, wherein the
dielectric liner is formed of one or more of aluminum oxide,
aluminum nitride, quartz, and sapphire, or other dielectric
material.

18. A plasma source comprising:
a dielectric tube having one or more interior surfaces
extending from a first opening at a first end of the
dielectric tube to a second opening at a second end of
the dielectric tube;

a coil antenna disposed around the dielectric tube; and a dielectric liner positioned inside the dielectric tube,
wherein the dielectric liner includes one or more outer surfaces, the dielectric liner is disposed around an interior
plasma-generating volume of the plasma source, the dielectric liner extends from a first end of the
dielectric liner to a second end of the dielectric liner, the dielectric liner is configured to be removed through
the first opening or the second opening of the dielec-
tric tube, the dielectric liner is positioned on one or more sup-
ports to center the dielectric liner in the dielectric
tube, the one or more outer surfaces of the dielectric liner are
spaced apart from the dielectric tube by a gap of less
than about 0.02 inches, and the dielectric liner has a thickness from about 0.05
inches to about 0.20 inches.

* * * * *